United States Patent
Saito

[11] Patent Number: 6,025,991
[45] Date of Patent: Feb. 15, 2000

[54] ELECTRONIC APPARATUS HAVING HEAT DISSIPATING ARRANGEMENT

[75] Inventor: Yoshio Saito, Fukushima-ken, Japan

[73] Assignee: Alps Electric Co., Ltd., Tokyo, Japan

[21] Appl. No.: 09/246,243

[22] Filed: Feb. 8, 1999

[30] Foreign Application Priority Data

Feb. 16, 1998 [JP] Japan ................................. 10-032803

[51] Int. Cl.[7] .................................................. H05K 7/20
[52] U.S. Cl. ........................... 361/704; 361/707; 361/709;
361/713; 361/719; 165/80.3; 165/185; 257/706;
257/707; 257/718; 257/719; 257/727; 174/52.1;
174/16.3
[58] Field of Search ..................................... 361/704, 705,
361/707, 709, 713, 736, 752, 719; 257/706,
707, 709, 713, 718, 719; 165/80.3, 185;
174/52.1, 16.3

[56] References Cited

U.S. PATENT DOCUMENTS

| | | | |
|---|---|---|---|
| 5,065,279 | 11/1991 | Lazenby et al. | 361/720 |
| 5,225,965 | 7/1993 | Bailey et al. | 361/704 |
| 5,309,979 | 5/1994 | Brauer | 165/80.2 |
| 5,321,582 | 6/1994 | Casperson | 361/713 |

FOREIGN PATENT DOCUMENTS

| | | |
|---|---|---|
| 54-92363 | 12/1977 | Japan . |
| 59-166488 | 4/1983 | Japan . |
| 4-25289 | 6/1990 | Japan . |

*Primary Examiner*—Gerald Tolin
*Assistant Examiner*—Boris L. Chervinsky
*Attorney, Agent, or Firm*—Brinks Hofer Gilson & Lione

[57] ABSTRACT

An electronic apparatus is provided to efficiently dissipate the heat generated by a heat generating electronic component. The electronic apparatus comprises a framework formed of a metal sheet to form an open end, a printed board disposed in the framework and having the heat generating component thereon, an inner cover disposed inside the framework by soldering and formed of a metal sheet having a tongue-shaped portion and an opening portion formed by being cut and hung, and an outer cover arranged so as to cover the open end of the framework and formed of a metal sheet having a tongue-shaped portion formed by being cut and hung, wherein the tongue-shaped portion of the inner cover is held in contact with the top of the heat generating component and, wherein the tongue-shaped portion of the outer cover is held in contact with the tongue-shaped portion of the inner cover through the opening portion of the inner cover.

4 Claims, 3 Drawing Sheets

ELECTRONIC APPARATUS HAVING HEAT DISSIPATING ARRANGEMENT

BACKGROUND OF THE INVENTION

1. Field of the Invention

The present invention relates to an electronic apparatus for use with a transmitting and receiving unit for mobile phones.

2. Description of the Related Art

FIG. 5 is a perspective view of a conventional electronic apparatus and FIG. 6 is a cross-sectional view of the conventional electronic apparatus.

A conventional electronic apparatus such as a transmitting and receiving unit for mobile phones has a rectangular-shaped framework 21 formed by bending a metal sheet. This framework 21 is formed of four side-walls 21a having two open ends 21b, 21c opened upward and downward, respectively.

In the outer peripheral portions of the side-walls 21a, a plurality of protruded portions 21d are formed adjacent to the open ends 21b, 21c.

Inside the framework 21 appropriately attached is a flat plate-shaped printed board 22, on which a power amplifier 23 and other electronic components (not shown) are disposed to form an electric circuit by electronic printed-wiring (not shown).

Metal sheet covers 24, 25 have a plurality of tabs 24a, 25a formed by bending the outer peripheral portions thereof and holes 24b, 25b formed in the tabs 24a, 25a, respectively.

In the cover 24, which is one of the covers, a tongue-shaped portion 24c is also disposed by being downwardly cut and hung from the top wall.

The covers 24, 25 are fixed to the framework 21 by snap-fitting the holes 24b, 25b of the tabs 24a, 25a in mating with protrusions 21d formed in the framework 21, covering the top and bottom open ends 21b, 21c, respectively. As shown in FIGS. 5 and 6, the tongue-shaped portion 24c disposed in the top cover 24 is held in contact with the top surface of the power amplifier 23 disposed on the printed board 22.

In this electronic apparatus, since the power amplifier 23 generates heat, its performance may be deteriorated. When the temperature increases to the utmost, the power amplifier 23 results in failure.

When the temperature of portions adjacent to the amplifier 23 of a case of a mobile phone, etc. containing the electronic apparatus increases, a person who picks up the case has an uncomfortable feeling.

Therefore, the structure of the apparatus is formed such that the heat generated by the power amplifier 23 is conducted from the tongue-shaped portion 24c to the cover 24 which is integral therewith and further conducted to ambient air from the entire cover 24 to disperse the heat locally generated.

In the conventional electronic apparatus described above, the heat generated by the power amplifier 23 is conducted to ambient air through the tongue-shaped portion 24c extended from the cover 24. However, since the conducting path is limited to the tongue-shaped portion 24c, heat dissipation is insufficient.

When the heat dissipation is insufficient, since a heating value of the power amplifier 23 surpasses the extent of heat release to increase the temperature of the power amplifier 23, not only can the deterioration in performance of the power amplifier 23 not be prevented but also the power amplifier 23 itself might fail.

SUMMARY OF THE INVENTION

In order to solve the above-mentioned problems, in accordance with the present invention, an electronic apparatus comprises a framework formed of a metal sheet to form an open end, a printed board disposed in the framework and having a heat generating component thereon, an inner cover disposed inside the framework by soldering and formed of a metal sheet having a tongue-shaped portion and an opening portion formed by being cut and hung, and an outer cover arranged so as to cover the open end of the framework and formed of a metal sheet having a tongue-shaped portion formed by being cut and hung, wherein the tongue-shaped portion of the inner cover is held in contact with the top of the heat generating component, and wherein the tongue-shaped portion of the outer cover is held in contact with the tongue-shaped portion of the inner cover through the opening portion of the inner cover.

In order to solve the above-mentioned problems, in accordance with the present invention, in the electronic apparatus, the tongue-shaped portion of the inner cover disposed inside the framework and the tongue-shaped portion of the outer cover fixed to the framework may be formed such that cutting root portions of both of the tongue-shaped portions do not overlap with each other in the vertical direction and flanks of both of the tongue-shaped portions do not overlap with each other in the vertical direction.

In order to solve the above-mentioned problems, in accordance with the present invention, the electronic apparatus may further comprise a thermal conductive resin layer, wherein the thermal conductive resin layer is disposed in at least one of the gap between the heat generating component and the tongue-shaped portion of the inner cover and the gap between the tongue-shaped portion of the inner cover and the tongue-shaped portion of the outer cover.

DESCRIPTION OF THE PREFERRED EMBODIMENTS

Figure 1:
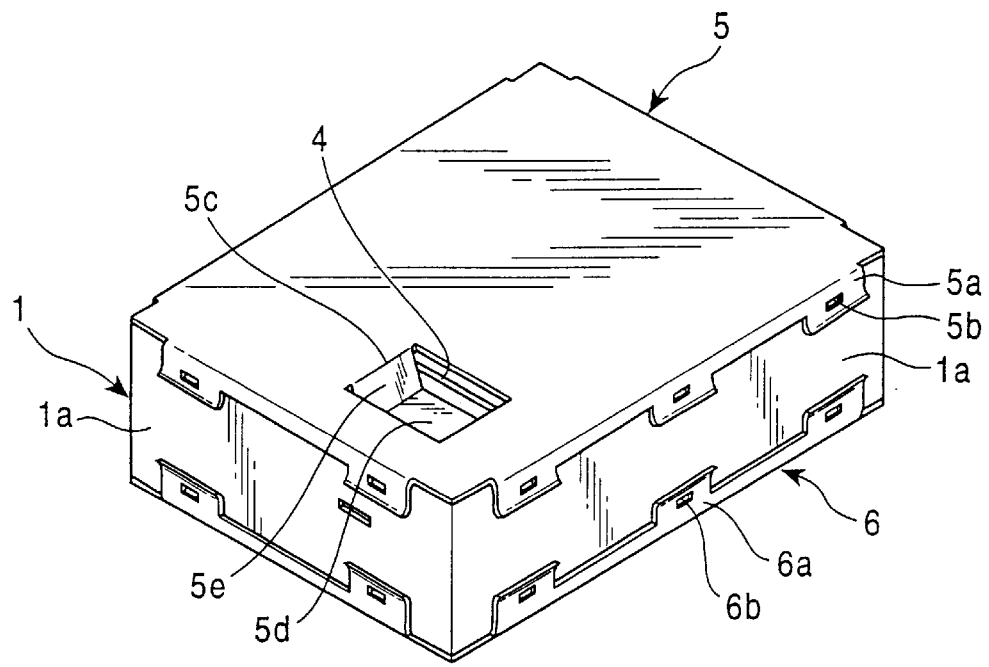
FIG. 1 is a perspective view of an electronic apparatus according to a first embodiment of the present invention.
Figure 2:
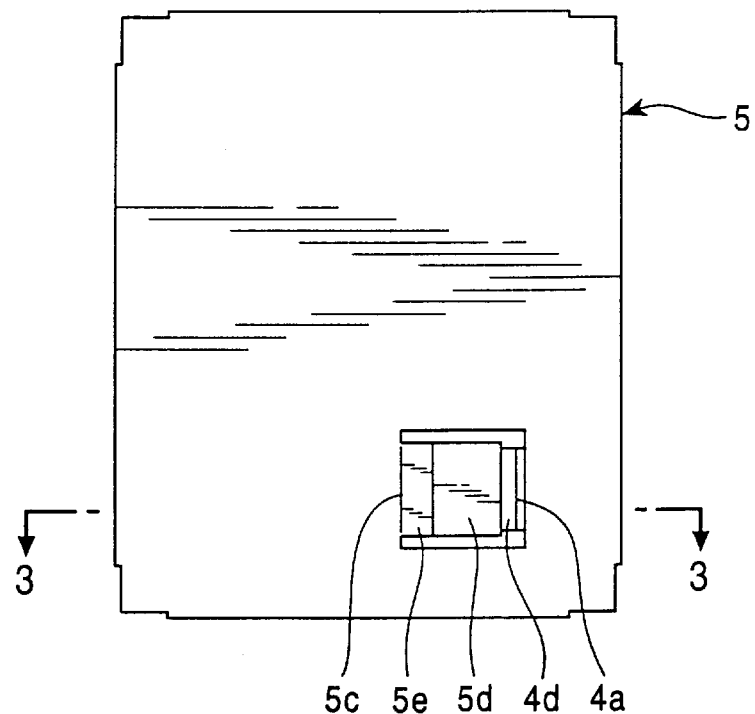
FIG. 2 is a plan view of the electronic apparatus according to the first embodiment of the present invention.

Hereinbelow, a first embodiment of an electronic apparatus according to the present invention will be described. FIG. 1 is a perspective view of an electronic apparatus according to a first embodiment of the present invention; FIG. 2 is a plan view of the electronic apparatus according to the first embodiment of the present invention; and FIG. 3 is a cross-sectional view at the line 3—3 of FIG. 2.

Figure 3:
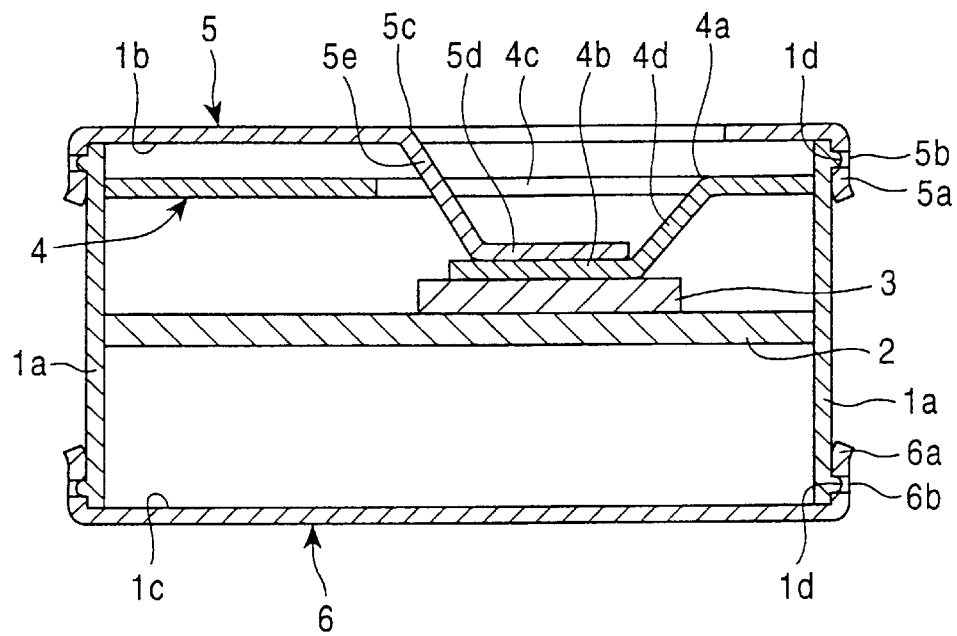
FIG. 3 is a cross-sectional view at the line 3—3 of FIG. 2.

As shown in FIGS. 1 to 3, a rectangular-shaped framework 1 formed by bending a metal sheet is formed of four side-walls 1a having two open ends 1b, 1c opened upward and downward, respectively.

In the outer peripheral portions of the side-walls 1a, a plurality of protruded portions 1d are formed adjacent to the open ends 1b, 1c.

Inside the framework 1, is appropriately attached a flat plate-shaped printed board 2, on which a heat generating component 3 such as a power amplifier and other electronic components (not shown) are disposed to form an electric circuit by electronic printed-wiring (not shown).

A rectangular-shaped metal sheet inner cover 4 is cut and hung down, and includes a tongue-shaped portion 4b connected to the inner cover 4 by a cutting root portion 4a, and an opening portion 4c formed when the tongue-shaped portion 4b is formed. The inner cover 4 is disposed inside the framework 1 by soldering, covering the open end 1b, over the printed board 2 disposed inside the framework 1. The tongue-shaped portion 4b is held in contact with the top surface of the heat generating component 3 disposed on the printed board 2, while the flank 4d of the tongue-shaped portion 4b is not held in contact with the top surface of the heat generating component 3.

Metal sheet outer covers 5, 6 have a plurality of tabs 5a, 6a formed by bending the outer peripheral portions thereof and holes 5b, 6b formed in the tabs 5a, 6a, respectively. In the outer cover 5, which is one of the outer covers, a tongue-shaped portion 5d connected to the outer cover 5 through a cutting root portion 5c is also disposed by being downwardly cut and hung from the top wall.

The outer covers 5, 6 are fixed to the framework 1 by fitting the holes 5b, 6b of the tabs 5a, 6a in mating with protrusions 1d formed in the framework 1, covering the top and bottom open ends 1b, 1c, respectively.

As shown in FIG. 3, passed through the opening portion 4c of the inner cover 4, the tongue-shaped portion 5d formed in the top outer cover 5 is overlaid and held in contact with the top surface of the tongue-shaped portion 4b which holds the heat generating component 3 disposed on the printed board 2, while the flank 5e of the tongue-shaped portion 5d is not held in contact with the top surface of the tongue-shaped portion 4b.

The tongue-shaped portions 4b, 5d are formed such that the cutting root portions 4a, 5c thereof do not overlap each other in the vertical direction, while the flanks 4d, 5e of the tongue-shaped portions 4b, 5d also do not overlap each other in the vertical direction.

That is, the tongue-shaped portion 4b of the inner cover 4 and the tongue-shaped portion 5d of the outer cover 5 are formed by being cut down and hung from different directions so as not to overlap each other in the vertical direction.

In the embodiment, in particular, as shown in FIG. 3, the tongue-shaped portion 4b of the inner cover 4 and the tongue-shaped portion 5d of the outer cover 5 are formed by being cut down and hung to opposite directions.

Figure 4:
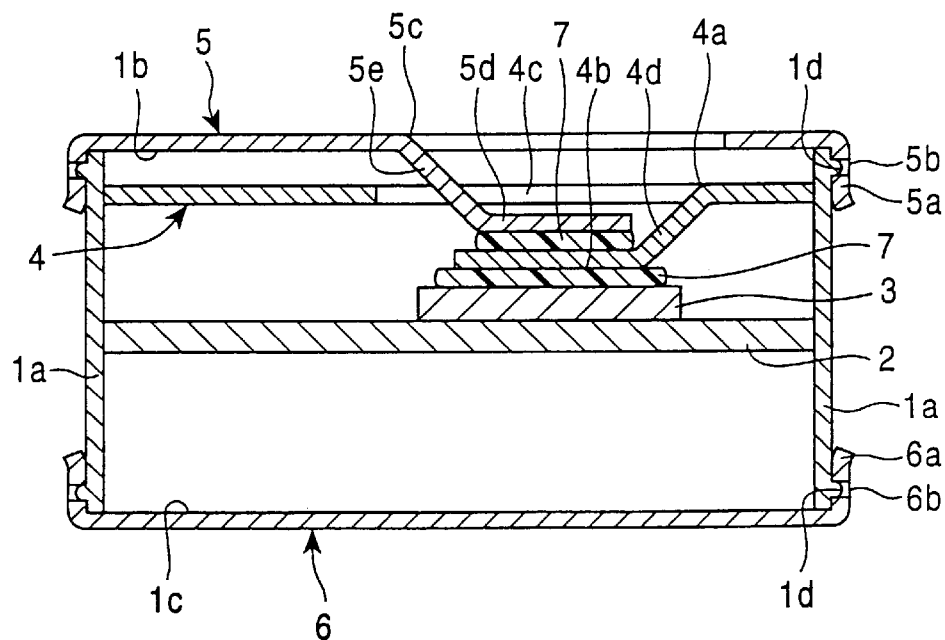
FIG. 4 is a cross-sectional view of an electronic apparatus according to a second embodiment of the present invention.
Figure 5:
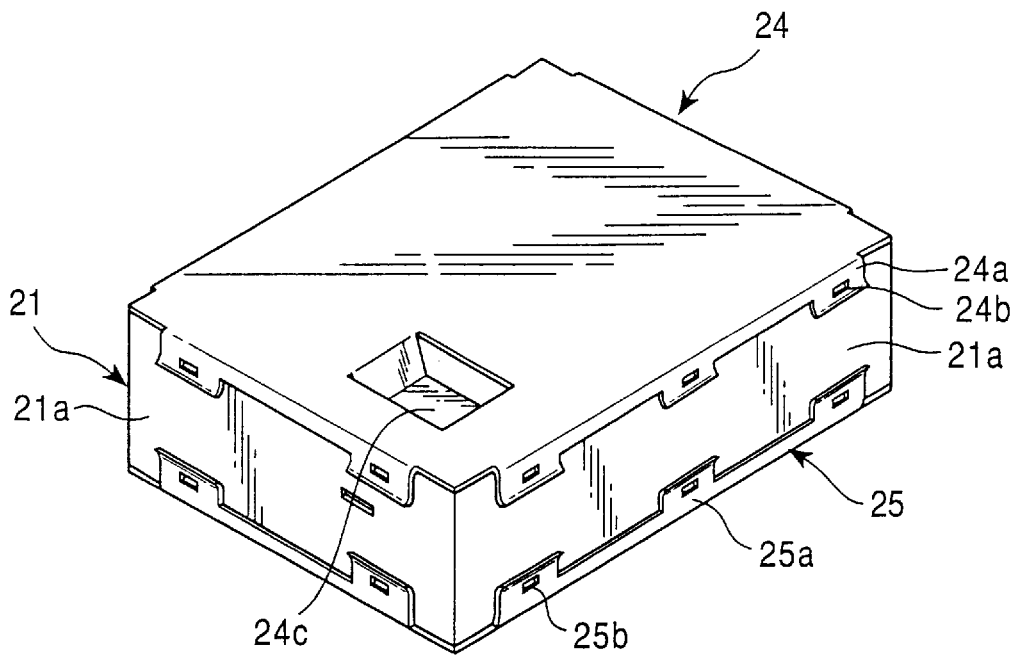
FIG. 5 is a perspective view of a conventional electronic apparatus.
Figure 6:
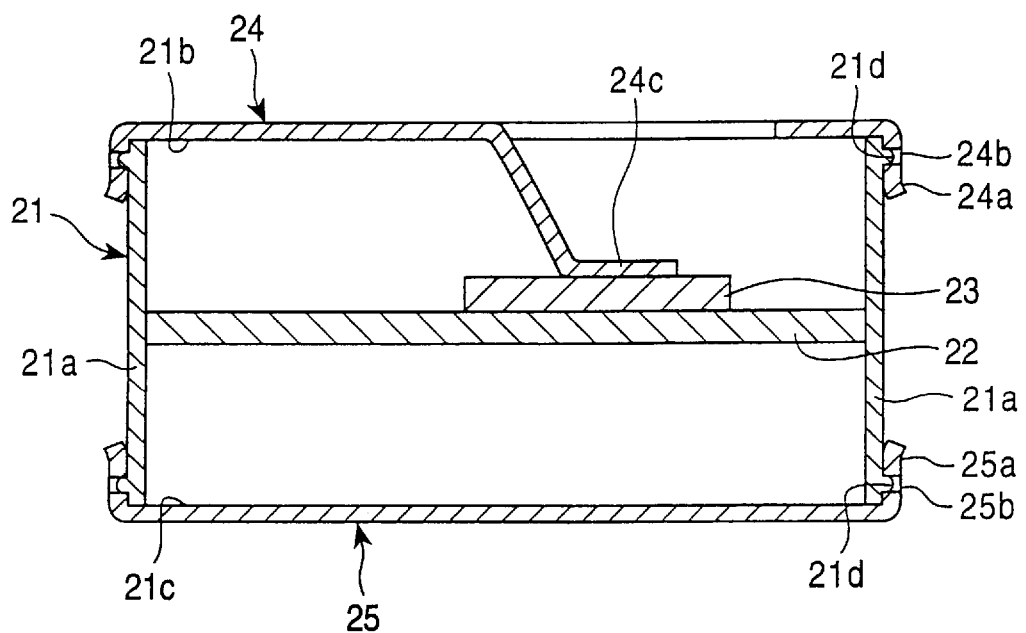
FIG. 6 is a cross-sectional view of the conventional electronic apparatus.

FIG. 4 is a cross-sectional view of a substantial part of an electronic apparatus according to a second embodiment of the present invention. In this embodiment, thermal conductive resin layers 7 are interposed between the tongue-shaped portion 4b and the heat generating component 3, and between the tongue-shaped portion 5d and the tongue-shaped portion 4b, respectively.

The thermal conductive resin layers 7 are disposed so as to partially extend off portions contacting with the tongue-shaped portions 4b, 5d to peripheral portions.

The thermal conductive resin layer 7 may be disposed whether between the tongue-shaped portion 4b and the heat generating component 3, or between the tongue-shaped portion 5d and the tongue-shaped portion 4b.

Parts of the configuration of this embodiment other than those described above are the same as the first embodiment. The description of the embodiment is abbreviated, in which like elements are given like reference numerals.

By being configured as described above, the electronic apparatus according to the present invention has excellent advantages as described below.

In accordance with the present invention, an electronic apparatus comprises a framework 1 formed of a metal sheet having open ends 1b, 1c, a printed board 2 disposed in the framework 1 having a heat generating component 3 thereon, an inner cover 4 disposed inside the framework 1 by soldering formed of a metal sheet having a tongue-shaped portion 4b and an opening portion 4cformed by being cut and hung, and an outer cover 5 disposed to cover the open end 1b of the framework 1 formed of a metal sheet having a tongue-shaped portion 5d formed by being cut and hung, wherein the tongue-shaped portion 4b of the inner cover 4 is held in contact with the top of the heat generating component 3 and wherein the tongue-shaped portion 5d of the outer cover 5 is held in contact with the tongue-shaped portion 4b of the inner cover 4 through the opening portion 4c of the inner cover 4. Accordingly, the heat generated by the heat generating component 3 is dissipated to ambient air by thermal conduction from the tongue-shaped portion 4b to the inner cover 4, or from the tongue-shaped portion 4b to the outer cover 5 through the tongue-shaped portion 5d. Since sufficient thermal conduction paths are ensured to dissipate the heat generated by the heat generating component 3 to ambient air, the heat dissipation effect can be enhanced.

The tongue-shaped portion 4b of the inner cover 4 disposed inside the framework 1 and the tongue-shaped portion 5d of the outer cover 5 fixed to the framework 1 are formed such that cutting root portions 4a, 5c of both of the tongue-shaped portions 4b, 5d do not overlap each other in the vertical direction and flanks 4d, 5e of both of the tongue-shaped portions 4b, 5d do not overlap each other in the vertical direction. Therefore, since the flank 4d of the tongue-shaped portion 4b is exposed to ambient air, direct heat dissipation from the flank 4d and the tongue-shaped portion 4b to ambient air is not blocked by the flank 5e of the tongue-shaped portion 5d, resulting in improvement in the heat dissipation effect.

The heat generated by the heat generating component 3 is dissipated in the two different directions of conduction from the tongue-shaped portion 4b to the outer cover 5 and of conduction from the tongue-shaped portion 5d to the outer cover 5. Accordingly, the heat is not locally concentrated to dissipate to ambient air by small unbalanced thermal conduction.

When the tongue-shaped portion 4b and the tongue-shaped portion 5d are formed by being cut and hung so as to oppose each other, the heat dissipation effect is especially enhanced.

When thermal a conductive resin layer 7, such as a thermal silicone, is interposed in one or both of the gap between the heat generating component 3 and the tongue-shaped portion 4b and the gap between the tongue-shaped portion 4b and the tongue-shaped portion 5d, the degree of adhesion between the heat generating component 3 and the tongue-shaped portion 4b and the degree of adhesion between the tongue-shaped portion 4b and the tongue-shaped portion 5d are increased to ensure the contact therebetween, respectively. Accordingly, the heat generated by the heat generating component 3 can be reliably conducted from the tongue-shaped portion 4b to the inner cover 4, and from the tongue-shaped portion 4*b* to the outer cover 5 through the tongue-shaped portion 5*d*, resulting in improvement in the heat dissipation effect to ambient air.

What is claimed is:

1. An electronic apparatus comprising:

a framework formed of a metal sheet to have an open end;

a printed board disposed in said framework, having a heat generating component thereon;

an inner cover disposed inside said framework by soldering, formed of a metal sheet having a tongue-shaped portion and an opening portion formed by being cut and hung; and an outer cover arranged so as to cover the open end of said framework, formed of a metal sheet having a tongue-shaped portion formed by being cut and hung, wherein the tongue-shaped portion of said inner cover is held in contact with the top of the heat generating component, and wherein the tongue-shaped portion of said outer cover is held in contact with the tongue-shaped portion of said inner cover through the opening portion of said inner cover.

2. An electronic apparatus according to claim 1, wherein the tongue-shaped portion of said inner cover disposed inside said framework and the tongue-shaped portion of said outer cover fixed to said framework are cut down and hung from different direction so as not to overlap each other in the vertical direction.

3. An electronic apparatus according to claim 1, further comprising a thermal conductive resin layer, wherein said thermal conductive resin layer is disposed in at least one of the gap between the heat generating component and the tongue-shaped portion of said inner cover and the gap between the tongue-shaped portion of said inner cover and the tongue-shaped portion of said outer cover.

4. An electronic apparatus according to claim 2, further comprising a thermal conductive resin layer, wherein said thermal conductive resin layer is disposed in at least one of the gap between the heat generating component and the tongue-shaped portion of said inner cover and the gap between the tongue-shaped portion of said inner cover and the tongue-shaped portion of said outer cover.

* * * * *